United States Patent
Brennan et al.

(10) Patent No.: US 6,395,100 B1
(45) Date of Patent: May 28, 2002

(54) METHOD OF IMPROVING VACUUM QUALITY IN SEMICONDUCTOR PROCESSING CHAMBERS

(75) Inventors: William S. Brennan; Willie Rivera, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/476,944

(22) Filed: Jan. 3, 2000

(51) Int. Cl.⁷ ................................................ B08B 7/00
(52) U.S. Cl. .......................... 134/19; 134/1.3; 134/31; 438/905; 156/345; 313/553; 417/51
(58) Field of Search .......................... 438/905; 134/1.3, 134/19, 31; 156/345; 313/553; 417/51

(56) References Cited

U.S. PATENT DOCUMENTS

| | | | |
|---|---|---|---|
| 4,432,813 A | * 2/1984 | Williams | 148/125 |
| 5,161,955 A | * 11/1992 | Danielson et al. | 417/51 |
| 5,866,978 A | * 2/1999 | Jones et al. | 313/495 |

FOREIGN PATENT DOCUMENTS

JP 3-14227 * 5/1990 ......... H01L/21/285

OTHER PUBLICATIONS

Stanely Wolf and Richard N. Tauber; *Silicon Processing for the VLSI Era*; vol. 1: Process Technology; pp. 92–95, 97 and 106–107; 1986 (Dec.).

* cited by examiner

*Primary Examiner*—Randy Gulakowski
*Assistant Examiner*—M. Kornakov
(74) *Attorney, Agent, or Firm*—Timothy M. Honeycutt

(57) ABSTRACT

Methods of removing gaseous phase contaminants from a processing chamber, such as a PVD chamber, are provided. In one aspect, a method of removing gaseous phase water from a processing chamber is provided that includes placing a heated substrate that has a titanium film in the processing chamber to dissociate a first portion of the gaseous phase water into hydrogen and oxygen and capture some of the oxygen in, the titanium film. The dissociated hydrogen and uncaptured oxygen are pumped from the processing chamber and the substrate is removed from the processing chamber. Pump down times and test wafer consumption may be reduced.

23 Claims, 1 Drawing Sheet

METHOD OF IMPROVING VACUUM QUALITY IN SEMICONDUCTOR PROCESSING CHAMBERS

BACKGROUND OF THE INVENTION

1. Field of the Invention

This invention relates generally to semiconductor fabrication, and more particularly to a method of removing contaminants from a semiconductor vacuum processing chamber.

2. Description of the Related Art

Many semiconductor fabrication processes occur in reduced pressure and/or gas flow environments. Examples of such processes are legion, and include techniques such as physical vapor deposition (sputter) ("PVD"), chemical vapor deposition ("CVD") and low pressure dry etching, to name just few. These various low pressure processes are carried out in a processing chamber in one form or another that incorporates one or possibly several types of vacuum systems. In some fabrication process, such as low pressure dry etching, the requirement for high and ultra vacuum regimes is dictated by the necessity for low operating pressures. In others, such as PVD and various CVD processes, the requirement for high vacuum is dictated by the need to remove gaseous contaminants from the processing chamber prior to the introduction of wafers for processing. The presence of contaminants, such as water, nitrogen and carbon dioxide in the chamber can radically degrade the performance of thin films deposited by PVD and CVD processes.

Metallization layers are particularly sensitive to contamination by residual gaseous particles in a processing chamber. Such gaseous contaminants frequently are the result of outgassing from the chamber walls of molecules left over from previous processing. In other circumstances, gaseous contaminants flow into the processing chamber during maintenance of the chamber, when the chamber is opened to the atmosphere for maintenance. Irrespective of their particular origin, contaminants in the vacuum chamber can significantly impact the resistivity, grain structure, surface texture, reflectivity, step coverage, electromigration and circuit reliability associated with a deposited metal film.

Three high vacuum pump systems that have historically been used with vacuum processing chambers include diffusion pumps, turbomolecular pumps and cryopumps. Diffusion pumps utilize a supersonic flow of atomized oil droplets to induce movement of gas particles from the chamber. Turbomolecular pumps operate much like well known turbine pumps that utilize a rotating shaft and a plurality of cooperating rotor and stator blades. Cryopumps are closed cycle refrigerator pumps that remove gases from the vacuum chamber by capturing them on a cold surface, either through the process of cryocondensation or cryosorption. Although these three pumping systems can achieve vacuums greater than $10^{-7}$ torr, they nevertheless exhibit certain limitations. Diffusion pumps produce some degree of oil backstreaming that can lead to oil contamination of the vacuum chamber, while all three pumping systems have pumping speed limitations. The limits on pumping speed are largely the result of the requirement for the throttling the flow into the pump from the chamber through the use of one or more throttling valves.

Conventional ultra and high vacuum processing chambers, such as those commonly used for PVD and CVD processes, require extensive physical pump down times and test wafer conditioning to remove gaseous contaminants from the processing chamber so that the production of high quality films is ensured. In those processing chambers that incorporate plasma processes, the chamber conditioning involves both a lengthy pump down and one or more test wafer conditioning steps. The pump down is typically carried out using one of the aforementioned high vacuum pumping systems alone or in combination with the others. The test wafer conditioning process involves the placement of a conditioning test wafer, which is either a bare silicon wafer or a silicon wafer coated with a silicon dioxide film, in the vacuum chamber and the subsequent creation of a plasma ambient which dissociates gaseous contaminant molecules into lighter species which may be pumped away from the vacuum chamber. An inert gas, such as argon, is frequently the ambient of choice for the plasma test wafer conditioning process. Depending upon the volume of the vacuum chamber, the overall chamber conditioning, including the chamber pump down and plasma test wafer conditioning process, may last from a few hours to one or more days.

While the incorporation of plasma based test wafer conditioning speeds the conditioning of a vacuum chamber and improves the overall vacuum quality thereof, many semiconductor processing chambers do not utilize plasma processes and reactions, and thus cannot take advantage of the benefits of test wafer conditioning through plasma processing. Examples of these non-plasma based processing chambers are legion, and include load locks, orientors, degassing, cool down chambers, passthrough chambers, buffers, rapid thermal processing chambers and holding chambers to name just a few. In such non-plasma processing, the conditioning of the vacuum chamber is carried out through pumping means only.

The main disadvantages associated with the conventional methods of conditioning vacuum chambers is the cost associated with the consumption of conventional conditioning wafers and the sheer length of the conditioning process due to the relatively slow pumping speeds of high vacuum pump systems. This speed phenomena is particularly germane to the multitudes of non-plasma based processing chambers, which cannot take advantage of the speed enhancing characteristics of plasma based test wafer conditioning.

In some previously used vacuum processing tools, a titanium gettering pump is coupled to the vacuum chamber to improve the vacuum characteristics in the chamber. A typical titanium gettering pump includes a sputter chamber connected and open to the processing chamber that is designed to sputtered titanium into vapor phase. Interatomic attractive forces between the titanium vapor and hydrogen, oxygen and water vapor draw the hydrogen, oxygen and water out of the processing chamber and into the gettering pump.

Titanium gettering pumps present certain disadvantages. The technique inherently involves some contamination of the processing chamber with titanium and the species used to sputter the titanium into vapor phase. This leads to difficult maintenance issues. In addition, titanium gettering pumps have limited ability to provide very low pressures.

The present invention is directed to overcoming or reducing the effects of one or more of the foregoing disadvantages.

SUMMARY OF THE INVENTION

In accordance with one aspect of the present invention, a method of removing gaseous phase contaminants from a processing chamber is provided that includes placing a heated titanium film in the processing chamber to dissociate a first portion of the gaseous phase contaminants and capture a second portion of the gaseous phase contaminants. The dissociated gaseous phase contaminants are pumped from the processing chamber and the titanium film is removed from the processing chamber.

In accordance with another aspect of the present invention, a method of removing gaseous phase water from a processing chamber is provided that includes placing a heated substrate that has a titanium film in the processing chamber to dissociate a first portion of the gaseous phase water into hydrogen and oxygen and capture some of the oxygen in the titanium film. The dissociated hydrogen and uncaptured oxygen are pumped from the processing chamber and the substrate is removed from the processing chamber.

In accordance with another aspect of the present invention, a method of removing gaseous phase contaminants from a processing chamber is provided that includes placing a first substrate in the processing and introducing a plasma ambient to remove some of the gaseous phase contaminants. A heated substrate that has a titanium film is placed in the processing chamber to dissociate a first portion of the gaseous phase contaminants and capture a second portion of the gaseous phase contaminants. The dissociated gaseous phase contaminants are pumped from the processing chamber and the substrate is removed from the processing chamber.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
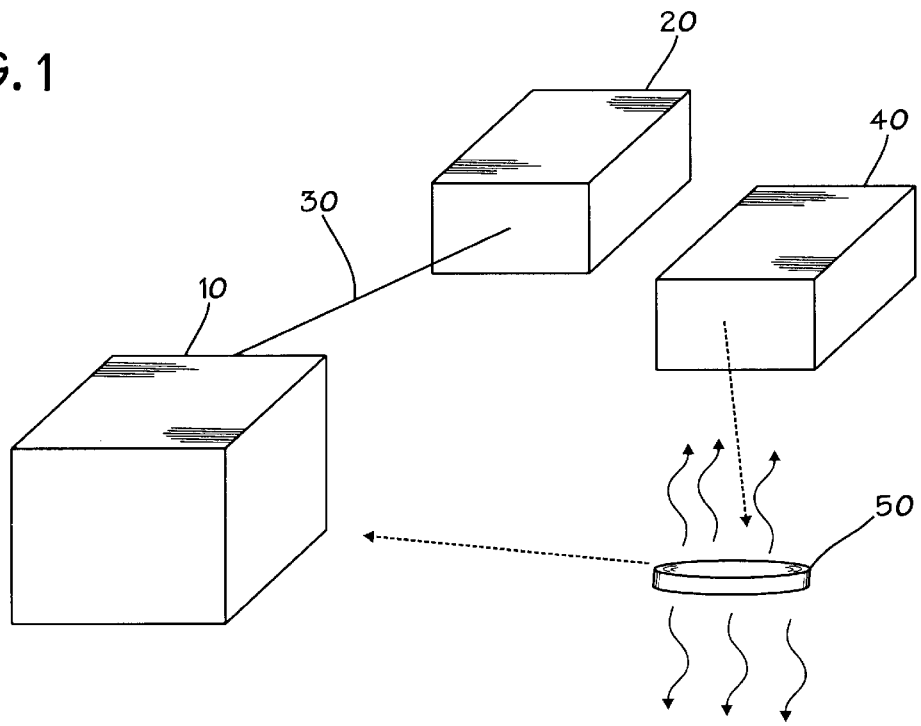
FIG. 1 is a pictorial view of an exemplary vacuum processing chamber, a vacuum pumping system and a wafer heating system in accordance with the present invention.

In the drawings described below, reference numerals are generally repeated where identical elements appear in more than one figure. Turning now to the drawings, and in particular to FIG. 1, therein is shown a pictorial view of an exemplary semiconductor vacuum processing chamber 10 that is connected to a pumping system 20 by means of a fluid line 30. A heating or degassing chamber 40 is provided for heating one or more conditioning wafers or workpieces 50. In accordance with the present invention, the heated conditioning wafer 50 is inserted into the processing chamber 10 to aid in the removal of gaseous phase contaminants therefrom and thus increase the vacuum level therein.

In accordance with the present invention, the processing chamber 10 may be a metal PVD chamber, a CVD chamber or virtually any other processing chamber wherein a vacuum is desirable to facilitate the processing. The fluid line 30 is a schematic representation of the connection between the processing chamber 10 and the pumping system 20. The actual connection may be by fluid lines or other means.

The pumping system 20 may be a cryopump, a turbomolecular pump, a diffusion pump or other well known pump used to evacuate processing chambers in semiconductor processing. Although the pump system 20 is illustrated as a single entity schematically in FIG. 1, it should be understood that the pumping system 20 may represent not only a single type of pumping system but one or more of the foregoing pumps working collectively.

The heating chamber 40 is advantageously capable of heating the conditioning wafer 50 to at least 100° C. with a rapid enough throughput that facilitates efficient semiconductor processing. In an exemplary embodiment, the heating chamber 40 is provided with the plurality of heat lamps (not shown) that enable the conditioning wafer 50 to be heated to about 250 to 400° C. in about 20 to 50 seconds. This medium temperature heating of the conditioning wafer 50 will outgas significant quantities of trapped gaseous contaminants from the conditioning wafer 50 which might otherwise outgas within the confines of the vacuum chamber 10. It is desirable to be able to transport the conditioning wafer 50 from the heating chamber 40 to the vacuum chamber 10 without breaking the vacuum. This may be accomplished by clustering the heating chamber 40 with the vacuum chamber 10 or by otherwise ensuring that wafer transport between the chambers 40 and 10 may be carried out without exposure to the atmosphere.

Figure 2:
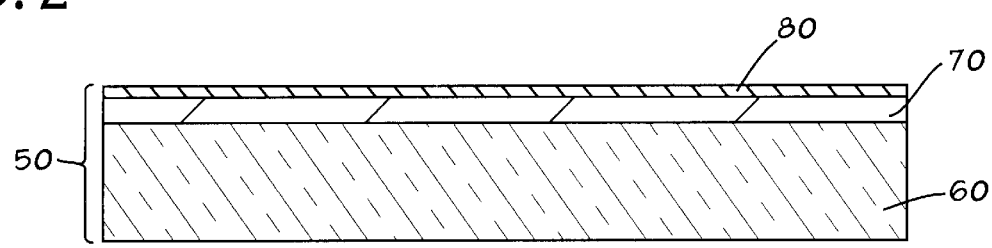
FIG. 2 is a cross-sectional view of an exemplary embodiment of a conditioning wafer incorporating a titanium film in accordance with the present invention.
Figure 3:
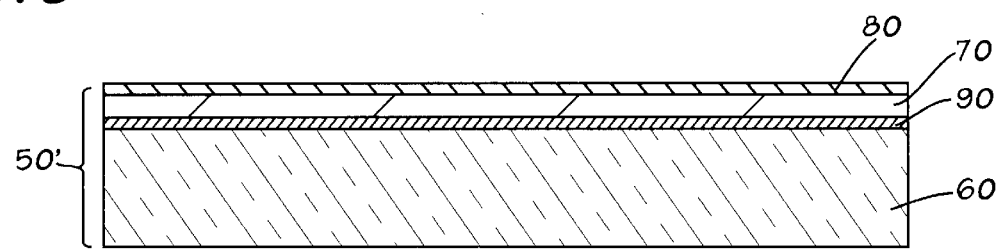
FIG. 3 is a cross-sectional view of an alternative conditioning wafer incorporating a titanium film in accordance with the present invention.

Exemplary structures for the conditioning wafer are illustrated respectively in FIGS. 2 and 3, which are cross-sectional views. In the first alternative illustrated in FIG. 2, the conditioning wafer 50 consists of a substrate 60 upon which a film 70 of titanium is formed. The substrate 60 may be composed of silicon, germanium, silicon-on-insulator or other substrate materials commonly used and well known in semiconductor fabrication and may be formed with the footprint of a well known semiconductor wafer to facilitate handling by various commercially available wafer handling equipment. However, the exact geometric configuration of substrate 60 is largely a matter of design discretion. The titanium film 70 acts as an aggressive gettering layer for facilitating the removal of gaseous phase contaminants from the vacuum chamber 10 as described more fully below. The thickness of the layer 70 is largely a matter of design discretion. In an exemplary embodiment, the layer may be about 150 to 1000 Å thick. The film 70 is advantageously deposited by PVD in an argon plasma process that may utilize DC or RF excitation. Optionally, the film 70 may be deposited by CVD if desired. Regardless of the particular formation technique, it is desirable for the film 70 to have a relatively high degree of purity so that unnecessary contamination of the vacuum chamber 10 is avoided. In an exemplary embodiment, titanium having a purity of about 99.99% to about 99.995% is used.

It is anticipated that a very thin film 80 of titanium oxide with a formula $TiO_x$ will form as a native oxide on the layer 70 following fabrication. This layer 80 is anticipated to be approximately 10 to 30 Å in thickness and will not adversely impact the gettering properties of the film 70.

An alternative structure for the conditioning wafer, now designated 50', may be understood by referring to FIG. 3. In this alternative structure, the substrate 60, the titanium film 70 with its corresponding oxide layer 80, may be formed and have the characteristics as generally described above in relation to FIG. 2. In this option, however, an insulating film 90 is interposed between the titanium film 70 and the substrate 60. The insulating film 90 may be composed of oxide, TEOS, nitride or a variety of other insulating materials that are commonly used to coat conditioning wafers. In this way, commercially available insulator-coated test wafers may be used as a substrate for the titanium film 70.

In another option, the titanium film 70 may be fabricated in a different shape as shown and without a substrate 60. Such a film 70 may be placed into the chamber 10 to achieve the aforementioned gettering effect.

Various illustrative methods of removing gaseous phase contaminants from the vacuum chamber 10 will now be described. In the first alternative, the conditioning wafer 50 is initially heated to about 250 to 400° C. to outgas trapped gaseous phase contaminants therefrom. The conditioning wafer 50 is then removed from the heating chamber 40 and inserted into the vacuum chamber 10. The conditioning wafer 50 will advantageously be above about 100° C. prior to insertion into the vacuum chamber 10. Although the titanium film 70 will getter gaseous phase impurities within the processing chamber 10 at room temperature, the reactivity, and thus the gettering ability of the film 70, increases with increasing temperature.

After insertion into the processing chamber 10, the conditioning wafer 50 is maintained for a preselected period. In an exemplary embodiment, the period is between 20 and 60 seconds. The reactivity of the titanium film 70 influences various gaseous phase contaminants that may be present within the chamber 10 in a variety of ways. Some contaminants will be dissociated into lighter species which may be pumped out of the chamber 10. Others will be captured by the film by chemical reaction, diffusion or other mechanism. For example, the film 70 will cause gaseous phase water to disassociate into gaseous phase hydrogen and oxygen. Some of the disassociated oxygen will react with the titanium film 70 to form additional $TiO_x$, and some will simply diffuse into the film 70. Much, if not most, of the disassociated hydrogen gas may then be pumped from the processing chamber 10 by the pumping system 20. Gaseous phase carbon dioxide present in the chamber 10 will be gettered by diffusion into the film 70. Gaseous phase nitrogen present in the processing chamber 10 will be similarly captured by the titanium film 70 through diffusion and via a titanium nitride forming chemical reaction.

Note that a pump down of the vacuum chamber 10 by the pumping system 20 may precede, succeed, or be performed concurrently with the dwelling of the conditioning wafer 50 within the chamber 10. Since the conditioning wafer 50 will normally be placed on a ceramic stage or carrier (not shown) within the processing chamber 10, little conductive heat transfer will occur. Similarly, there will be little if any heat loss from the conditioning wafer 50 due to convection. Accordingly, it is anticipated that the conditioning wafer 50 will retain much of its heat while in the vacuum chamber 10 as radiation heat losses are anticipated to be fairly low. Accordingly, the gettering action of the film 70 will remain high throughout the period in which the conditioning wafer 50 is present in the vacuum chamber 10.

In another alternative, in accordance with the present invention, test wafer plasma deposition conditioning may precede the introduction of the conditioning wafer 50. This exemplary process may be applied in circumstances where the processing chamber 10 utilizes plasma processes. For example, one or more commercially available bare silicon or silicon dioxide coated silicon test wafers may be subjected to plasma deposition conditioning in argon plasma within the processing chamber 10 to remove some of the gaseous phase contaminants contained therein. A pump down via the pump system 20 may precede the test wafer plasma deposition conditioning if desired. Subsequent to the test wafer plasma deposition conditioning, the processing chamber 10 will ordinarily be pumped down to remove the remaining plasma ambient and various gaseous phase contaminants that may be present within the chamber 10. The conditioning wafer 50 may then be placed into the vacuum chamber 10 to getter gaseous phase contaminants as described above. As with the foregoing illustrated alternative, the processing chamber 10 may be pumped down during and/or after the introduction of the conditioning wafer 50.

If the titanium film 70 is of sufficient thickness, there may be sufficient titanium remaining following the gettering of the gaseous phase contaminants in the processing chamber so that the conditioning wafer 50 may be subsequently reused if the overlying oxide film 80 is etched away. For example, the conditioning wafer 50 may be removed from the processing chamber 10, and subjected to an etch to remove not only the native oxide film 80 but any subsequently formed titanium oxide from disassociated oxygen within the chamber 10. The etch may be wet or dry, with or without plasma, with endpoint detection by timing or emission spectroscopy. Depending upon the initial thickness of the titanium film 70, this refurbishing of the conditioning wafer 50 may be carried out several times before the conditioning wafer 50 requires replacement.

The skilled artisan will appreciate that the process of the present invention provides for the efficient removal of various gaseous phase contaminants from a vacuum processing chamber. Frequently used high and ultra vacuum pumping techniques to evacuate processing chambers may be readily augmented through the incorporation of a titanium film conditioning wafer, resulting in much lower pump down time and lower consumption of conventional silicon and oxide coated silicon conditioning wafers.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all is to cover all modifications, equivalents and alternatives falling within the spirit and scope of the invention as defined by the following appended claims.

What is claimed is:

1. A method of removing gaseous phase contaminants from a semiconductor processing chamber, comprising:

placing a heated titanium film in the semiconductor processing chamber to dissociate a first portion of the gaseous phase contaminants and capture a second portion of the gaseous phase contaminants;

pumping the dissociated gaseous phase contaminants from the semiconductor processing chamber; and removing the titanium film from the semiconductor processing chamber.

2. The method of claim 1, wherein the heated titanium film is formed on a semiconductor substrate prior to insertion into the semiconductor processing chamber.

3. The method of claim 1, wherein the gaseous phase contaminants comprise water vapor, the dissociated gaseous phase contaminants comprise oxygen and hydrogen, and the second portion of the gaseous phase contaminants comprises oxygen.

4. The method of claim 1, wherein the second portion is absorbed by diffusion.

5. The method of claim 1, wherein the dissociated gaseous phase contaminants are pumped while the titanium film is in the semiconductor processing chamber.

6. The method of claim 1, wherein the dissociated gaseous phase contaminants are pumped after the titanium film is removed from the semiconductor processing chamber.

7. The method of claim 1, wherein the semiconductor processing chamber is pumped down prior to inserting the heated titanium film into the semiconductor processing chamber.

8. The method of claim 1, comprising plasma conditioning a test wafer in the semiconductor processing chamber prior to inserting the heated titanium film in the semiconductor processing chamber.

9. The method of claim 1, wherein the titanium film is formed by PVD.

10. A method of removing gaseous phase water from a semiconductor processing chamber, comprising:

placing a heated substrate having a titanium film in the semiconductor processing chamber to dissociate a first portion of the gaseous phase water into hydrogen and oxygen and capture some of the oxygen in the titanium film;

pumping the dissociated hydrogen and uncaptured oxygen from the semiconductor processing chamber; and removing the substrate from the semiconductor processing chamber.

11. The method of claim 10, wherein the dissociated gaseous phase contaminants are pumped while the substrate is in the semiconductor processing chamber.

12. The method of claim 10, wherein the dissociated gaseous phase contaminants are pumped after the substrate is removed from the semiconductor processing chamber.

13. The method of claim 10, wherein the semiconductor processing chamber is pumped down prior to inserting the heated substrate into the semiconductor processing chamber.

14. The method of claim 10, comprising plasma conditioning a test wafer in the semiconductor processing chamber prior to inserting the heated substrate in the semiconductor processing chamber.

15. The method of claim 10, wherein the titanium film is formed by PVD.

16. A method of removing gaseous phase contaminants from a processing chamber, comprising:

placing a heated semiconductor substrate having a titanium film thereon in the processing chamber to dissociate a first portion of the gaseous phase contaminants and capture a second portion of the gaseous phase contaminants;

pumping the dissociated gaseous phase contaminants from the processing chamber; and removing the titanium film from the processing chamber.

17. The method of claim 16, wherein the gaseous phase contaminants comprise water vapor, the dissociated gaseous phase contaminants comprise oxygen and hydrogen, and the second portion of the gaseous phase contaminants comprises oxygen.

18. The method of claim 16, wherein the second portion is absorbed by diffusion.

19. The method of claim 16, wherein the dissociated gaseous phase contaminants are pumped while the titanium film is in the processing chamber.

20. The method of claim 16, wherein the dissociated gaseous phase contaminants are pumped after the titanium film is removed from the processing chamber.

21. The method of claim 16, wherein the processing chamber is pumped down prior to inserting the heated titanium film into the processing chamber.

22. The method of claim 16, comprising plasma conditioning a test wafer in the processing chamber prior to inserting the heated titanium film in the processing chamber.

23. The method of claim 16, wherein the titanium film is formed by PVD.

* * * * *